(12) United States Patent
Yuan et al.

(10) Patent No.: US 7,333,179 B2
(45) Date of Patent: Feb. 19, 2008

(54) MOVING MECHANISM WITH HIGH BANDWIDTH RESPONSE AND LOW FORCE TRANSMISSIBILITY

(75) Inventors: Bausan Yuan, San Jose, CA (US); Martin E. Lee, San Jose, CA (US); W. Thomas Novak, Hillsborough, CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 10/918,182

(22) Filed: Aug. 13, 2004

(65) Prior Publication Data

US 2006/0033903 A1   Feb. 16, 2006

(51) Int. Cl.
*G03B 27/58* (2006.01)
*G03B 27/62* (2006.01)

(52) U.S. Cl. .......................................... 355/72; 355/75
(58) Field of Classification Search .............. 318/114, 318/135; 310/12; 355/53, 67, 72, 75
See application file for complete search history.

(56) References Cited

U.S. PATENT DOCUMENTS

| | | | | |
|---|---|---|---|---|
| 5,323,012 A | * | 6/1994 | Auslander et al. | 250/492.2 |
| 6,040,096 A | * | 3/2000 | Kakizaki et al. | 430/5 |
| 2002/0185983 A1 | * | 12/2002 | Poon et al. | 318/10 |
| 2003/0197845 A1 | * | 10/2003 | Morisada | 355/53 |
| 2004/0160203 A1 | * | 8/2004 | Carter et al. | 318/114 |
| 2004/0165172 A1 | * | 8/2004 | Poon et al. | 355/72 |
| 2005/0093502 A1 | * | 5/2005 | Poon et al. | 318/592 |
| 2005/0190351 A1 | * | 9/2005 | Cox et al. | 355/53 |

* cited by examiner

*Primary Examiner*—Henry Hung Nguyen
(74) *Attorney, Agent, or Firm*—Aka Chan LLP

(57) ABSTRACT

Methods and apparatus for providing a stage with a relatively high positioning bandwidth and low transmissibility are disclosed. According to one aspect of the present invention, a method for positioning a stage including providing a first force of a first magnitude to the stage using a primary actuator and providing a second force of a second magnitude to the stage using a secondary actuator. The first force is arranged to cause the stage to translate along a first axis. The secondary actuator is also arranged to cause the stage to translate along the first axis, and has a relatively high positioning bandwidth. The first force is arranged to enable the stage to be relatively coarsely positioned and the second force is arranged to enable the stage to be relatively finely positioned. In one embodiment, the secondary actuator is one of a voice coil motor and a piezoelectric motor.

43 Claims, 11 Drawing Sheets

MOVING MECHANISM WITH HIGH BANDWIDTH RESPONSE AND LOW FORCE TRANSMISSIBILITY

BACKGROUND OF THE INVENTION

1. Field of Invention

The present invention relates generally to semiconductor processing equipment. More particularly, the present invention relates to a mechanism that enables the accuracy and bandwidth associated with a moving stage may be positioned to be improved.

2. Description of the Related Art

For precision instruments such as photolithography machines which are used in semiconductor processing, factors which affect the performance, e.g., accuracy, of the precision instrument generally must be dealt with and, insofar as possible, eliminated. When the performance of a precision instrument is adversely affected, as for example by pitching moments, products formed using the precision instrument may be improperly formed and, hence, function improperly. For instance, a photolithography machine which is subjected to pitching moments may cause an image projected by the photolithography machine to move, and, as a result, be aligned incorrectly on a projection surface such as a semiconductor wafer surface.

Scanning stages such as wafer scanning stages and reticle scanning stages are often used in semiconductor fabrication processes, and may be included in various photolithography and exposure apparatuses. Wafer scanning stages are generally used to position a semiconductor wafer such that portions of the wafer may be exposed as appropriate for masking or etching. Reticle scanning stages are generally used to accurately position a reticle or reticles for exposure over the semiconductor wafer. Patterns are generally resident on a reticle, which effectively serves as a mask or a negative for a wafer. When a reticle is positioned over a wafer as desired, a beam of light or a relatively broad beam of electrons may be collimated through a reduction lens, and provided to the reticle on which a thin metal pattern is placed. Portions of a light beam, for example, may be absorbed by the reticle while other portions pass through the reticle and are focused onto the wafer.

Stages, e.g., either a wafer positioning stage or a reticle positioning stage, are often required to be relatively high accuracy stages, since the positioning of wafers and reticles is critical in ensuring that beams may be properly focused onto the wafer. For example, in order to ensure that a reticle may be properly positioned, it is typically desirable for a reticle positioning stage to be a high precision stage.

Therefore, what is needed is a method and an apparatus for improving the accuracy with which a moving stage may be positioned. That is, what is desired is a system and a method for increasing the bandwidth and the precision associated with positioning a moving stage of an overall stage apparatus without significantly increasing the mass of the overall stage apparatus.

SUMMARY OF THE INVENTION

The present invention relates to stage apparatus which has a relatively high positioning bandwidth and low transmissibility. According to one aspect of the present invention, a method for positioning a stage including providing a first force of a first magnitude to the stage using a primary actuator and providing a second force of a second magnitude to the stage using a secondary actuator. The first force is arranged to cause the stage to translate along a first axis. The secondary actuator is also arranged to cause the stage to translate along the first axis, and has a relatively high positioning bandwidth. The first force is arranged to enable the stage to be relatively coarsely positioned and the second force is arranged to enable the stage to be relatively finely positioned. In one embodiment, the secondary actuator is one of a voice coil motor and a piezoelectric motor.

A stage that is driven by a linear motor or a voice coil motor (VCM) which moves a long stroke may effectively become a relatively high precision stage by adding a secondary actuator with a relatively small counter mass to the stage. The secondary actuator, which may be a piezoelectric motor or a VCM, provides the stage with the capability to be moved relatively finely without significantly increasing the mass of an overall stage device which includes the stage. Further, the secondary actuator in cooperation with the small counter mass may function as an active damper which is arranged to provide damping to the stage in order to prevent stage oscillations from being transmitted through the body of the overall stage device.

According to another aspect of the present invention, a stage apparatus includes a stage, a first actuator that positions the stage with respect to a first axis and is coupled to the stage, and a second actuator that affects the position of the stage along the first axis and is coupled to the stage. The stage apparatus also includes a control arrangement which controls the first actuator and the second actuator to position the stage. In one embodiment, the first actuator coarsely positions the stage and the second actuator finely positions the stage. In another embodiment, the second actuator is arranged to provide damping to the stage.

In accordance with still another aspect of the present invention, a stage apparatus includes a moving stage that supports an object, a first actuator that positions the stage with respect to a first axis and is arranged to enable the stage to be positioned using relatively long strokes, and a second actuator which has a relatively high positioning bandwidth and affects the position of the stage along the first axis. Both the first actuator and the second actuator are coupled to the stage. The apparatus also includes a control arrangement and an interferometer system. The control arrangement controls the first actuator and the second actuator to position the stage, and the interferometer system determines a position of the object supported on the moving stage. The control arrangement is arranged to use the determined position to control the first actuator and the second actuator.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

Many stages, e.g., reticle stages or wafer stages, may not be as precisely positioned as desired. Often, measures taken to improve the precision of stages involve reducing either the effect of vibrations or oscillations or reducing the transmissibility of vibrations or oscillations. For example, the mass of the stage may be increased to reduce the effect of vibrations. Although increasing the rigidity and, hence, the mass, of the stage may reduce the effect of vibrations on an overall stage device, increasing the rigidity may require increasing the size of a linear motor or a voice coil motor (VCM) which drives the stage and enables the stage to move with a relatively long stroke. Increasing the size of a motor which drives the stage may not be acceptable in many situations.

A relatively high precision and, therefore, relatively high bandwidth stage that is driven by a linear motor or a VCM which moves a long stroke may be achieved by adding a secondary actuator, with a relatively small counter mass, to the stage. That is, a single stage with both coarse positioning capabilities and fine positioning capabilities may be achieved by enabling both a relatively low bandwidth actuator and a relatively high bandwidth actuator to drive the stage. In one embodiment, the secondary actuator may be a piezoelectric motor or a relatively small VCM, which may be preloaded. The addition of a secondary actuator which has a relatively high bandwidth as compared with the linear motor or the VCM which moves the stage using a long stroke, e.g., coarsely, enables the stage to be moved relatively finely without significantly increasing the mass of an overall stage device which includes the stage. In addition, the secondary actuator in cooperation with the small counter mass may function as an active damper which is arranged to provide damping to the stage in order to prevent stage oscillations from being transmitted through the body of the overall stage device.

To allow a stage or a moving mechanism to be finely positioned or, alternatively, to be damped by an active damper, a secondary actuator or a "position bandwidth" actuator may be used to enable the acceleration and the velocity of the stage to be finely adjusted to allow a desired position to be efficiently, and accurately, reached. The secondary actuator may also be used to provide active damping for the stage. When a faster response time is needed with respect to using the secondary actuator to move the stage or to damp vibrations, a piezoelectric motor may be used as a secondary actuator. Alternatively, when a less expensive secondary actuator is desired, a preloaded VCM may be used as a secondary actuator.

Figure 1:
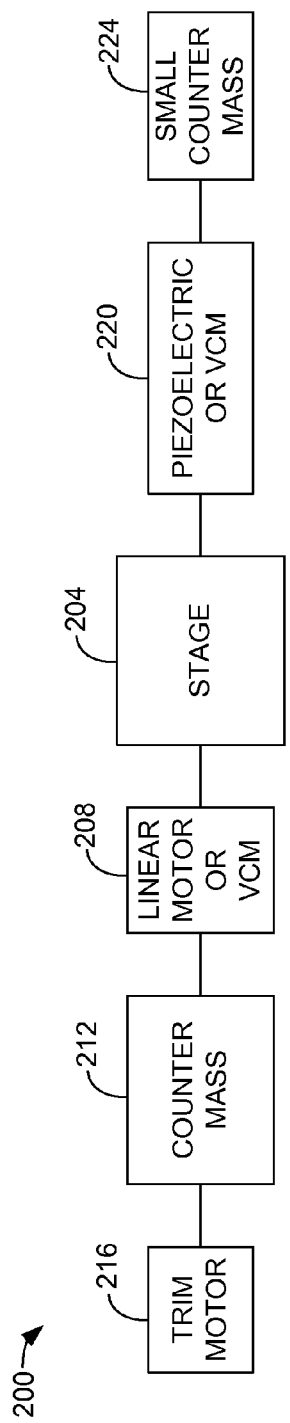
FIG. 1 is a diagrammatic block diagram representation of a stage apparatus which includes a position bandwidth piezoelectric motor or a voice coil motor and a small counter mass in accordance with an embodiment of the present invention.

FIG. 1 is a diagrammatic block diagram representation of a stage apparatus which includes a position bandwidth piezoelectric motor or a VCM and a small counter mass in accordance with an embodiment of the present invention. A stage apparatus 200 includes a moving stage mechanism 204, e.g., a wafer stage or a reticle stage. Stage 204 is generally coupled to an actuator 208, as for example a motor such as a linear motor or a VCM, which is arranged to enable stage 204 to translate. Stage 204 may translate when actuator 208 causes a force to be applied to stage 204, or stage 204 may translate when actuator 208 moves stage 204 from a first position to a second position. A counter mass 212 may be coupled to actuator 208 in order to reduce the transmissibility of vibrations from actuator 208 into stage 204, and to absorb any significant reaction forces generated by actuator 208. Often, counter mass 212 is further coupled to a trim motor 216 which enables vibrations or oscillations of counter mass 212, which may result when actuator 208 enables stage 204 to accelerate, to be transmitted to a grounding surface (not shown).

A high bandwidth position actuator 220, which may be a piezoelectric motor or a VCM, is coupled to stage 204. Typically, a piezoelectric motor may be used as high bandwidth position actuator 220 when a faster response time is desired, while a VCM may be used as high bandwidth position actuator 220 when a lower cost is desired and a slower response time is acceptable. High bandwidth position actuator 220 is arranged to enable stage 204 to be positioned more precisely, and to increase the bandwidth associated with the positioning of stage 204. For example, while actuator 208 is generally an actuator which provides a bandwidth from zero Hertz (Hz) to approximately 100 Hz or less, high bandwidth position actuator 220 may provide a bandwidth from zero Hz to more than approximately 1000 Hz, e.g., a bandwidth from zero to approximately one kilohertz (kHz). As a result, the positioning of stage 204 may be more precise due to the higher bandwidth afforded by high bandwidth position actuator 220. It should be appreciated that both high bandwidth position actuator 220 and actuator 208 may be arranged to move stage 204 along a common axis.

High bandwidth position actuator 220 is further coupled to a small counter mass 224 such that reaction forces associated with high bandwidth position actuator 220 may be substantially absorbed by small counter mass 224. Hence, vibrations are generally not transmitted from high bandwidth position actuator 220 to stage 204. Further, vibrations of stage 204 which may be transmitted into a body (not shown) of stage apparatus 200 may be substantially prevented from being transmitted by both counter mass 212 and small counter mass 224. As such, in addition to serving to increase the bandwidth with which stage 204 may be positioned, high bandwidth position actuator 220 may also serve the purpose of providing active damping capabilities for stage 204 by allowing an amount of damping on stage 204 to be adjusted by tuning or adjusting actuator 220.

Figure 2:
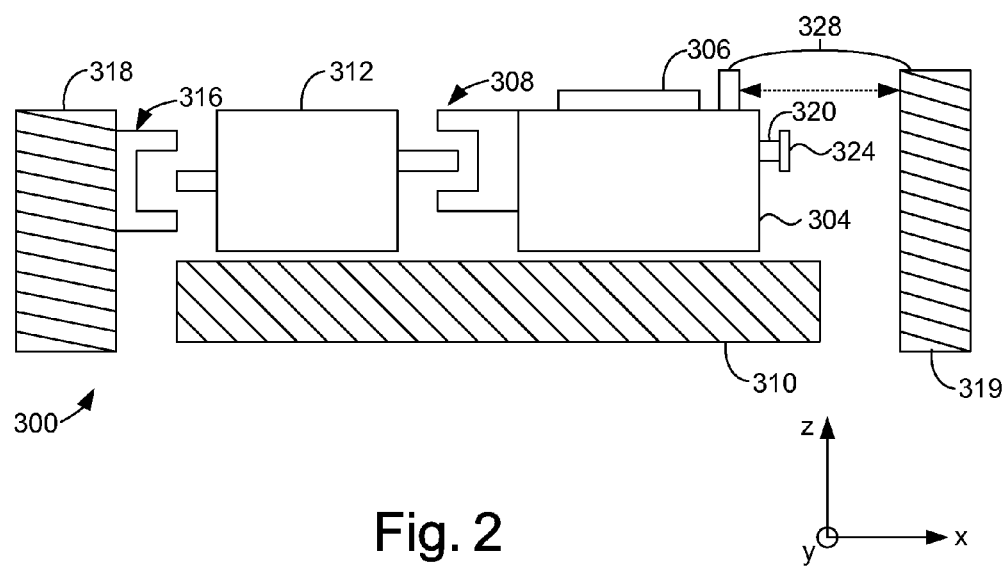
FIG. 2 is a diagrammatic representation of a stage apparatus which includes a high bandwidth position actuator which is a piezoelectric motor in accordance with an embodiment of the present invention.

As previously mentioned, a high bandwidth position actuator such as high bandwidth position actuator 220 may be an actuator such as a piezoelectric motor or a VCM. FIG. 2 is a diagrammatic representation of a stage apparatus which includes a high bandwidth position actuator which is a piezoelectric motor in accordance with an embodiment of the present invention. A stage apparatus 300 includes a body 310 which supports a stage 304, and a counter mass 312. Stage 304 is arranged to support an object 306 such as a wafer or a reticle. Relatively "coarse" movements or long strokes may be imparted on stage 304 using an actuator 308, which is typically a linear motor or a VCM. A counter mass 312, which is coupled to a trim motor 316, is arranged to absorb reaction forces associated with actuator 308, while trim motor 316 is arranged to enable a ground member 318 to substantially absorb vibrations associated with counter mass 312 to effectively prevent the vibrations from being transmitted to stage 304. Often, a position sensor (not shown) for counter mass 312 may enable the position of counter mass 312 to be measured with respect to ground member 318 such that trim motor 316 may be substantially dynamically adjusted to ensure that vibrations associated with counter mass 312 may be absorbed by ground member 318.

A piezoelectric motor 320, which is relatively lightweight, is coupled to stage 304 to provide stage 304 with the capability to be more precisely positioned. In the described embodiment, an interferometer system 328, which often includes a mirrored surface that may be coupled to stage 304 and a surface 319, respectively, may be used to measure a position of object 306 such that the position of object 306 may be provided to piezoelectric motor 320 in order for piezoelectric motor 320 to be adjusted to position object 306 as desired using stage 304. It should be appreciated that interferometer system 328 is typically also used to provide a controller for actuator 308 with a position measurement such that actuator 308 may be moved as appropriate. Surface 319 may be part of a frame included in stage apparatus 300 that supports either a lens or a reticle stage, and may generally be part of a metrology frame of stage apparatus 300.

Piezoelectric motor 320 is coupled to a small counter mass 324 which is arranged to absorb substantially any significant reaction forces which may be generated by piezoelectric motor 320. By absorbing the reaction forces, stage oscillations or vibrations associated with stage 304 may be reduced. Such oscillations may be substantially prevented from being transmitted into body 310.

In general, the size of small counter mass 324 may vary. By way of example, the size of small counter mass 324 may be at least partially dependent upon the size of piezoelectric motor 320. The size of small counter mass 324 may also be at least partially dependent upon a desired stroke length for stage 304. In one embodiment, small counter mass 324 may have a mass that is between approximately ten times and approximately 100 times smaller than the mass of stage 304. Substantially any suitable material may be used to form small counter mass 324. By way of example, small counter mass 324 may be formed from steel.

Figure 3A:
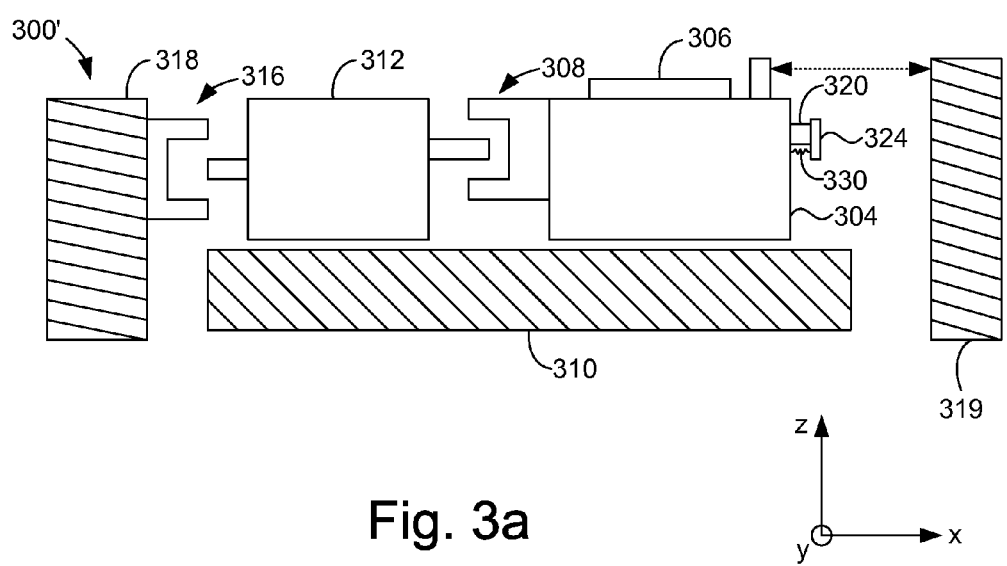
FIG. 3a is a diagrammatic representation of a stage apparatus which includes a high bandwidth position actuator which is a preloaded piezoelectric motor in accordance with an embodiment of the present invention.

To facilitate the assembly of piezoelectric motor 320 into stage apparatus 300, piezoelectric motor 320 may be preloaded, as for example using a spring, a flexure, or a similar mechanism. FIG. 3a is a diagrammatic representation of a stage apparatus which includes a high bandwidth position actuator which is a preloaded piezoelectric motor in accordance with an embodiment of the present invention. A stage apparatus 300' includes stage 304, actuator 308, counter mass 312, trim motor 316, and a body 310, as described above with respect to FIG. 2. Piezoelectric motor 320, which is substantially coupled between stage 320 and small counter mass 324, is preloaded by a preload mechanism 330. Although preload mechanism 330 has been illustrated as a spring, it should be appreciated that preload mechanism 330 may instead by a flexure or any other mechanism.

In lieu of using piezoelectric motor 320 as a high bandwidth position actuator, a VCM may instead be used as a high bandwidth position actuator. As previously mentioned, a piezoelectric motor 320 may provide higher bandwidth capabilities and, hence, more precision than a VCM. However, when it is not necessary to have the precision afforded by piezoelectric motor 320, a VCM or, more specifically, a preloaded VCM may be used as a high bandwidth position actuator, as a VCM is generally less expensive than a piezoelectric motor. It should be appreciated that a preloaded VCM that may be used as a "secondary" or high bandwidth position actuator is typically physically smaller than a VCM that may be used as a "primary" actuator, e.g., actuator 208 of FIG. 1.

Figure 3B:
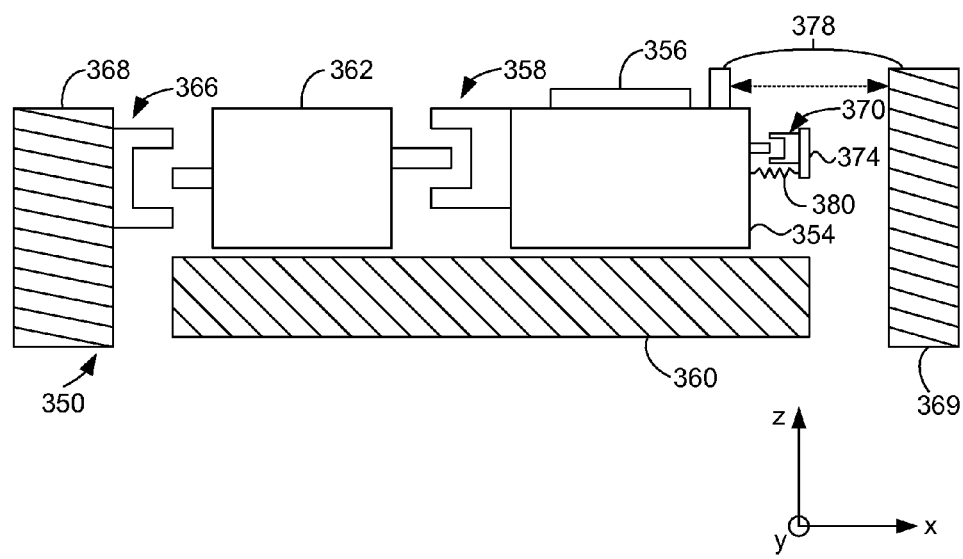
FIG. 3b is a diagrammatic representation of a stage apparatus which includes a high bandwidth position actuator which is a preloaded voice coil motor in accordance with an embodiment of the present invention.

Referring next to FIG. 3b, a stage apparatus which includes a high bandwidth position actuator which is a preloaded VCM will be described in accordance with an embodiment of the present invention. A stage apparatus 350 includes a body 360 which is arranged to support a moving stage 354, which scans over body 360, as well as an actuator 358 which enables stage 354 to scan. A counter mass 362 is arranged to absorb reaction forces associated with actuator 358, which is typically a linear motor or a VCM, and is effectively coupled to a ground surface 368 through a trim motor 366. Trim motor 366, as will be appreciated by those skilled in the art, may be substantially controlled using signals provided by a position sensor (not shown) which senses the position of counter mass 362.

A VCM 370, which is preloaded using a preload mechanism 380, is arranged to increase the precision with which stage 354 may be positioned. Preload mechanism 380 may be a spring with a relatively high spring constant, or preload mechanism 380 may be a flexure or a similar mechanism. A small counter mass 374 which is coupled to VCM 370 is arranged to absorb reaction forces generated by VCM 370. As shown, preload mechanism 380 is positioned between stage 354 and counter mass 374. Small counter mass 374 may generally be sized depending upon factors which may include, but are not limited to, the length of anticipated strokes associated with stage 354, the size of VCM 370, and the size of stage 354.

Both VCM 370 and actuator 358 may use readings provided by an interferometer system 378 which obtains a position reading associated with an object 356 supported on stage 354 to move stage 354 as appropriate to achieve a desired position, as will be discussed below with respect to FIGS. 6a and 6b. Specifically, VCM 370 and actuator 358 may be adjusted to enable object 356 to accurately reach a desired position without the positioning being compromised by vibrations within moving stage 356 or body 360.

Although a high bandwidth position actuator may generally be coupled to a moving stage and a small counter mass, in another embodiment, a high bandwidth position actuator may instead be coupled to the moving stage and to an actuator, e.g., actuator 208 of FIG. 1, which imparts coarse movements on the stage. In other words, rather than utilizing a substantially dedicated counter mass to absorb reaction forces associated with the high bandwidth position actuator, the weight of an actuator such as actuator 208 of FIG. 1 may instead be used as a counter mass which absorbs reaction forces associated with the high bandwidth position actuator.

Figure 4:
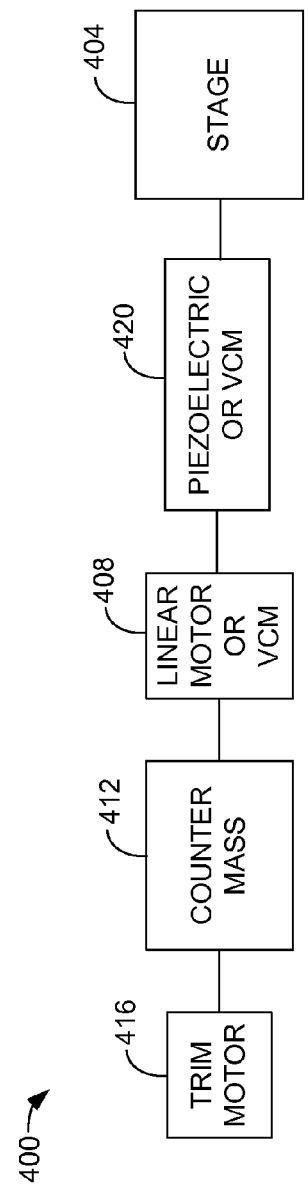
FIG. 4 is a diagrammatic block diagram representation of a stage apparatus which includes a position bandwidth piezoelectric motor or a voice coil motor and a small counter mass in accordance with another embodiment of the present invention.

As shown in FIG. 4, a stage apparatus 400 may include a high bandwidth position actuator 420 that is coupled between an actuator 408, which is arranged to enable a stage 404 to scan, and stage 404. High bandwidth position actuator 420 provides a relatively high bandwidth with regards to the positioning of stage 404 and, as a result, enables stage 404 to be positioned more precisely. Reaction forces generated by high bandwidth position actuator 420 may be substantially absorbed by actuator 408, while reaction forces generated by actuator 408 may be substantially absorbed by a counter mass 412. A trim motor 416 is generally arranged to enable oscillations or vibrations associated with counter mass 412 to be transmitted to a ground surface (not shown).

Figure 5A:
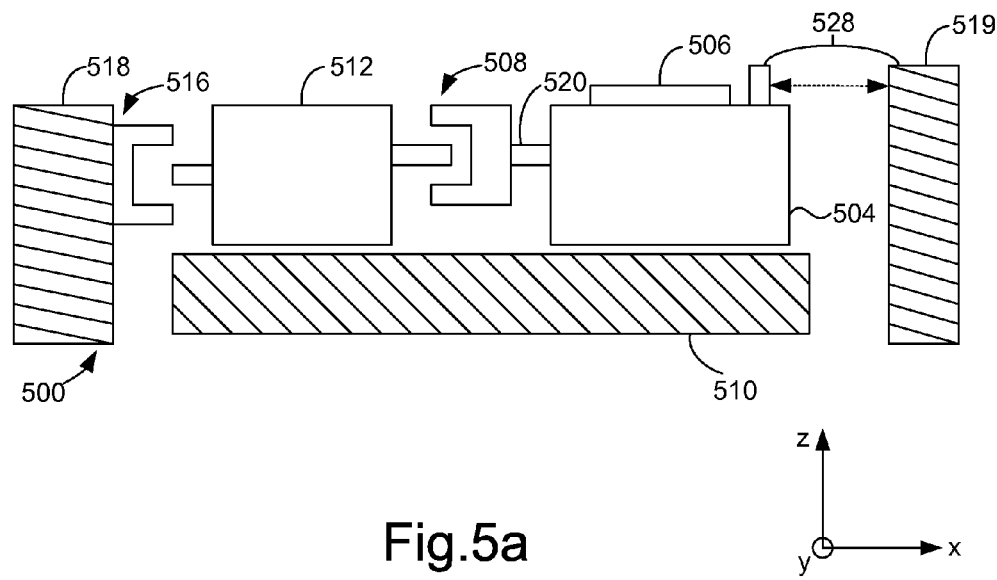
FIG. 5a is a diagrammatic representation of a stage apparatus which includes a high bandwidth position actuator that is a piezoelectric motor positioned between an actuator and a stage in accordance with an embodiment of the present invention.

With reference to FIG. 5a, a stage apparatus which includes a high bandwidth position actuator which is a piezoelectric motor positioned between an actuator and a stage will be described in accordance with an embodiment of the present invention. A stage apparatus 500 includes a body 510 which supports a stage 504, and a counter mass 512. An object 506, e.g., a wafer or a reticle, is supported on stage 504 such that stage may be translated to move object 506. An actuator 508 and a piezoelectric motor 520 may cooperate to enable stage 504 and, hence, object 506 to be accurately positioned with a relatively high bandwidth. In general, relatively coarse movements or long strokes may be imparted on stage 504 using actuator 508. Piezoelectric motor 520, which is coupled to actuator 508 and to stage 504, may serve the purpose of enabling finer, or more precise, movements of stage 504 to be made.

A counter mass 512, which is coupled to a trim motor 516, is arranged to absorb reaction forces generated when actuator 508 causes stage 504 to move, while trim motor 516 is arranged to enable a ground member 518 to substantially absorb vibrations associated with counter mass 512. The use of trim motor 516 may effectively prevent the vibrations absorbed by counter mass 512 from being transmitted to stage 504 by allowing the vibrations to be transmitted to ground member 518. It should be appreciated that a position sensor (not shown) for counter mass 512 may be used to enable a position of counter mass 512, which may be measured with respect to ground member 518, to be used to substantially dynamically adjust variables associated with trim motor 516 to ensure that vibrations associated with counter mass 512 may be absorbed by ground member 518.

In the described embodiment, reaction forces generated when piezoelectric motor 520, which is relatively lightweight in comparison with actuator 508 and stage 504, enables stage 504 to be finely positioned may be absorbed by actuator 508. That is, actuator 508 may effectively serve as a counter mass which absorbs reaction forces associated with piezoelectric motor 520.

Stage apparatus 500 also includes an interferometer system 528 that may be coupled to stage 504 and surface 519, which may be a part of a frame assembly, to measure a position of object 506 such that the position of object 506 may be provided to piezoelectric motor 520 and actuator 508. Providing readings from interferometer system 528 to piezoelectric motor 520 enables piezoelectric motor 520 to be adjusted to more accurately position object 506 as desired using stage 504. Similarly, position measurements or readings from interferometer system 528 are typically also provided to actuator 508 to enable actuator 508 to be moved appropriately to achieve a desired position for stage 504 and, hence, object 506.

Figure 5B:
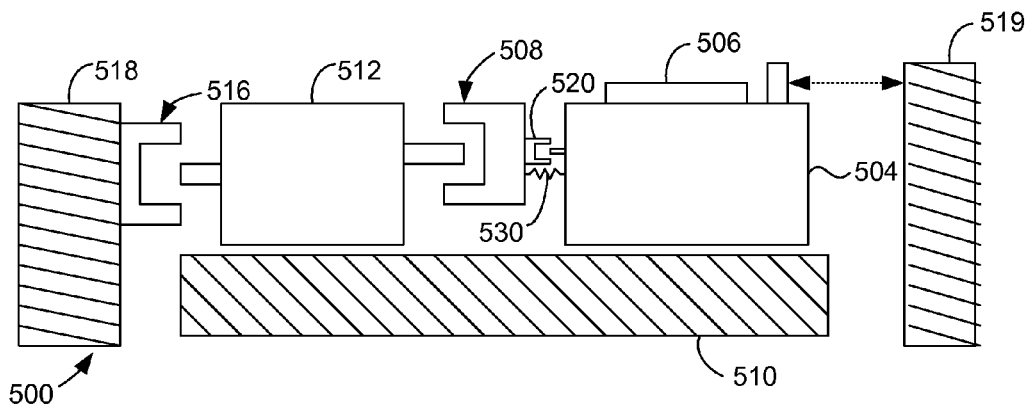
FIG. 5b is a diagrammatic representation of a stage apparatus which includes a high bandwidth position actuator that is a preloaded piezoelectric motor positioned between an actuator and a stage in accordance with an embodiment of the present invention.

Piezoelectric motor 520, in one embodiment, may effectively be preloaded for assembly into stage apparatus 500. Referring next to FIG. 5b, a stage apparatus which includes a high bandwidth position actuator which is a preloaded piezoelectric motor that is positioned between an actuator and a stage will be described in accordance with an embodiment of the present invention. A stage apparatus 500' includes stage 504, actuator 508, counter mass 512, trim motor 516, and a body 510, as described above with respect to FIG. 5a. Piezoelectric motor 520 is preloaded by a preload mechanism 530, which may be a spring, a flexure, or substantially any other mechanism which may be preloaded and substantially assembled between actuator 508, e.g., a relatively low bandwidth actuator, and stage 504. Providing preload mechanism 530 to enable piezoelectric motor 520 to be preloaded allows the assembly of piezoelectric motor 520 to be performed more efficiently.

While a piezoelectric motor such as piezoelectric motor 520 of FIG. 5a provides relatively high bandwidth positioning capabilities to a stage apparatus, other types of actuators may instead be used to increase the precision with which a stage may be positioned. That is, substantially any actuator which is determined to be sufficient to achieve the precision positioning required by a stage apparatus may generally be used. One suitable actuator may be an EI-core motor.

Figure 6A:
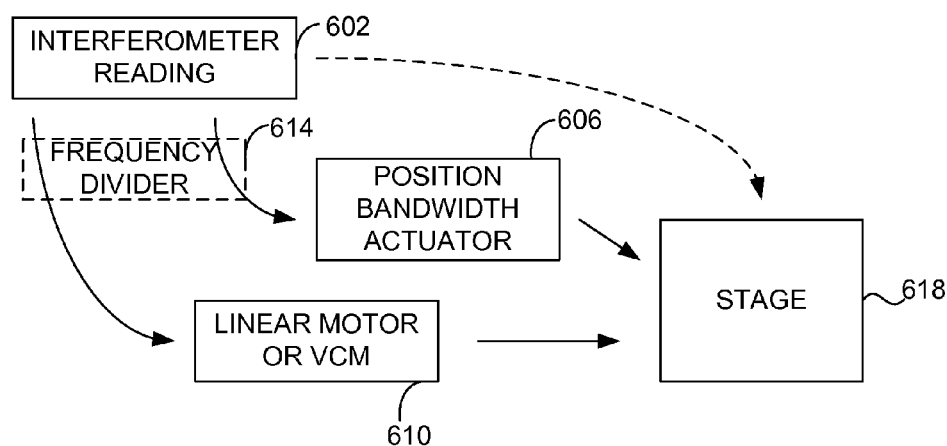
FIG. 6a is a block diagram representation of one control system which may be used to control the position of a stage, e.g., stage 304 of FIG. 2 or stage 504 of FIG. 5a, in accordance with an embodiment of the present invention.

With reference to FIG. 6a, one control system which may be used to control the position of a stage, e.g., stage 304 of FIG. 2 or stage 504 of FIG. 5a, will be described in accordance with an embodiment of the present invention. An interferometer reading 602, which may be obtained from an interferometer which measures a position of an object supported by a stage 618, is provided to a high bandwidth position actuator 606 and to a "coarse positioning" or low bandwidth positioning actuator 610. As discussed above, a high bandwidth position actuator 606 provides relatively high bandwidth positioning capabilities to stage 618, while low bandwidth positioning actuator 610 provides relatively low bandwidth positioning capabilities to stage 618.

In one embodiment, interferometer reading 602 may be passed through a frequency divider (bandpass filter) 614, which may be implemented using software code devices, that effectively divides or splits interferometer reading 602. The split interferometer reading 602 is basically provided as position feedback information to high bandwidth position actuator 606 and low bandwidth actuator 610 that enables high bandwidth position actuator 606 and low bandwidth actuator 610 to be adjusted to enable stage 618 to be moved to a desired position.

Generally, interferometer reading 602 may be substantially continuously obtained or periodically obtained such that high bandwidth position actuator 606 and low bandwidth actuator 610 may be dynamically adjusted or adjusted in real-time to allow the positioning of stage 618 to be altered as needed. When high bandwidth position actuator 606 is adjusted or otherwise tuned dynamically, high bandwidth position actuator 606, in cooperation with a counter mass (not shown) coupled to high bandwidth position actuator 606, may effectively serve as an active damper to damp vibrations associated with stage 618.

Figure 6B:
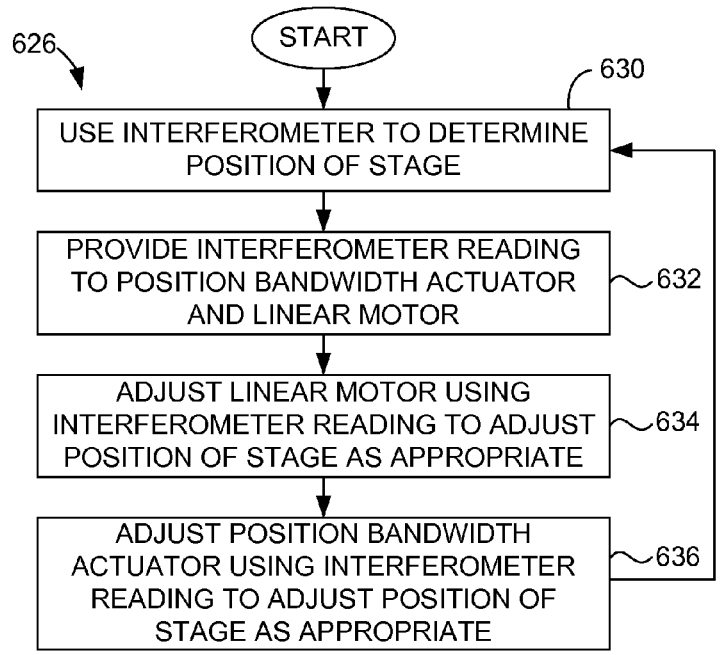
FIG. 6b is a process flow diagram which illustrates one method of controlling the movement of a stage that includes a high bandwidth position actuator will be described in accordance with an embodiment of the present invention.

Referring next to FIG. 6b, one method of controlling the movement of a stage which includes a high bandwidth position actuator such as a piezoelectric motor or a VCM will be described in accordance with an embodiment of the present invention. A method 626 of controlling the movement of a stage begins at step 630 in which an interferometer is used to determine a position associated with the stage. In one embodiment, an interferometer is arranged to measure the position of a wafer or a reticle which is supported on the stage. Once the position associated with the stage is determined, the position reading from the interferometer is provided in step 632 to a high bandwidth position actuator and a low bandwidth actuator, e.g., a linear motor, which are arranged to allow the stage to translate. Using the interferometer reading, the linear motor may be adjusted or tuned such that the position of the stage may be adjusted as appropriate in step 634. In addition, the high bandwidth position actuator may also be adjusted using the interferometer reading in order to enable the position of the stage to be adjusted as needed in step 636. Once the position of the stage has been adjusted, process flow returns to step 630 in which the interferometer is used to determine a position associated with the stage.

Figure 7:
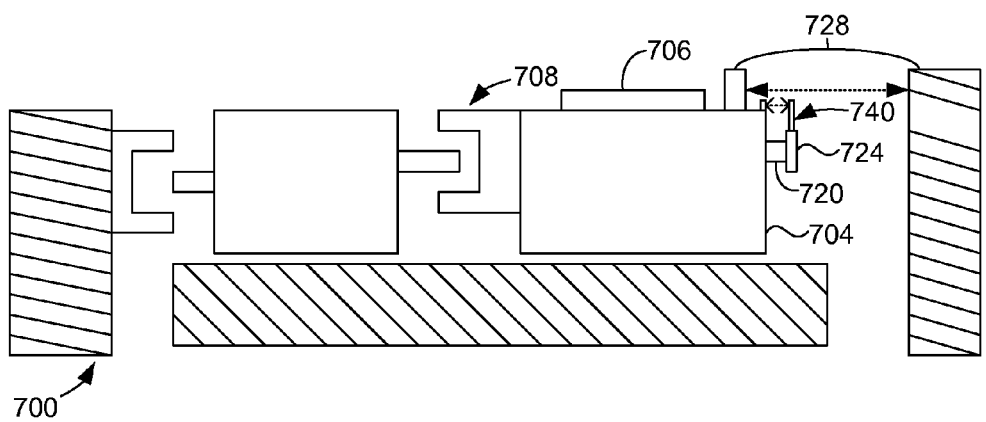
FIG. 7 is a diagrammatic representation of a stage apparatus which includes a high bandwidth position actuator which has a dedicated position sensor in accordance with an embodiment of the present invention.

In one embodiment, instead of using an interferometer reading to adjust or tune a high bandwidth position actuator, a high bandwidth position actuator may have a dedicated sensor which enables a position of a stage to be measured with respect to a small counter mass coupled to the high bandwidth position actuator. FIG. 7 is a diagrammatic representation of a stage apparatus which includes a high bandwidth position actuator which has a dedicated position sensor in accordance with an embodiment of the present invention. A stage apparatus 700 includes a stage 704 and a high bandwidth position actuator 720 which, as shown, is a piezoelectric motor, although high bandwidth position actuator 720 may instead be a VCM. High bandwidth position actuator 720 is coupled to a small counter mass 724 which is arranged to absorb reaction forces which may be generated when high bandwidth position actuator 720 is used to enable a position associated with stage 704 to be altered.

An interferometer system 728, which is typically arranged to measure a position associated with an object 706 supported on stage 704, provides position readings which may be used by a low bandwidth actuator 708, or an actuator that effectively enables stage 704 to undergo coarse movements. A second sensor system 740, which may include an interferometer, is arranged to measure a position associated with stage 704 and to provide a position reading to high bandwidth position actuator 720 such that adjustments may be made to high bandwidth position actuator 720 to alter a position of stage 704 as appropriate. The second sensor system 740 may further be arranged to be in communication with interferometer system 728 such that the positioning of stage 704 may effectively be coordinated such that low bandwidth actuator 708 and high bandwidth position actuator 720 may cooperate to enable stage 704 to be moved as needed to position object 706 in a desired position.

Figure 8A:
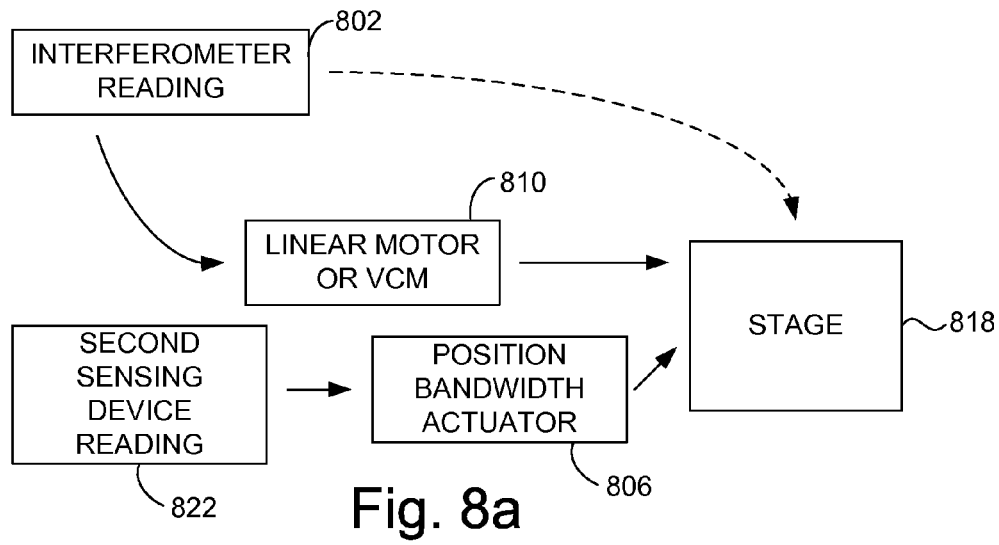
FIG. 8a is a block diagram representation of a control system which may be used to control the position of a stage, e.g., stage 704 of FIG. 7, using two stage position sensors in accordance with an embodiment of the present invention.

FIG. 8a is a block diagram representation of a control system which may be used to control the position of a stage, e.g., stage 704 of FIG. 7, using two stage position sensors in accordance with an embodiment of the present invention. An interferometer reading 802, which may be obtained from an interferometer which measures a position of an object supported by a stage 818, is provided to a low bandwidth actuator 810 such as a linear motor which enables stage 818 to be coarsely positioned. A reading from a second sensing device 822, e.g., a position sensing system such as position sensing system 740 of FIG. 7, is provided to a high bandwidth position actuator 806. Typically, the reading from the second sensing device may be a position reading associated with stage 818.

While interferometer reading 802 may be provided as position feedback information to low bandwidth actuator 810 which enables low bandwidth actuator 810 to be adjusted to enable stage 818 to be moved coarsely to a position near a desired position. Second sensing system reading 822 may be provided as position feedback information to high bandwidth position actuator 806 such that high bandwidth position actuator may be adjusted to enable stage 818 to be substantially precisely moved to a desired position.

Figure 8B:
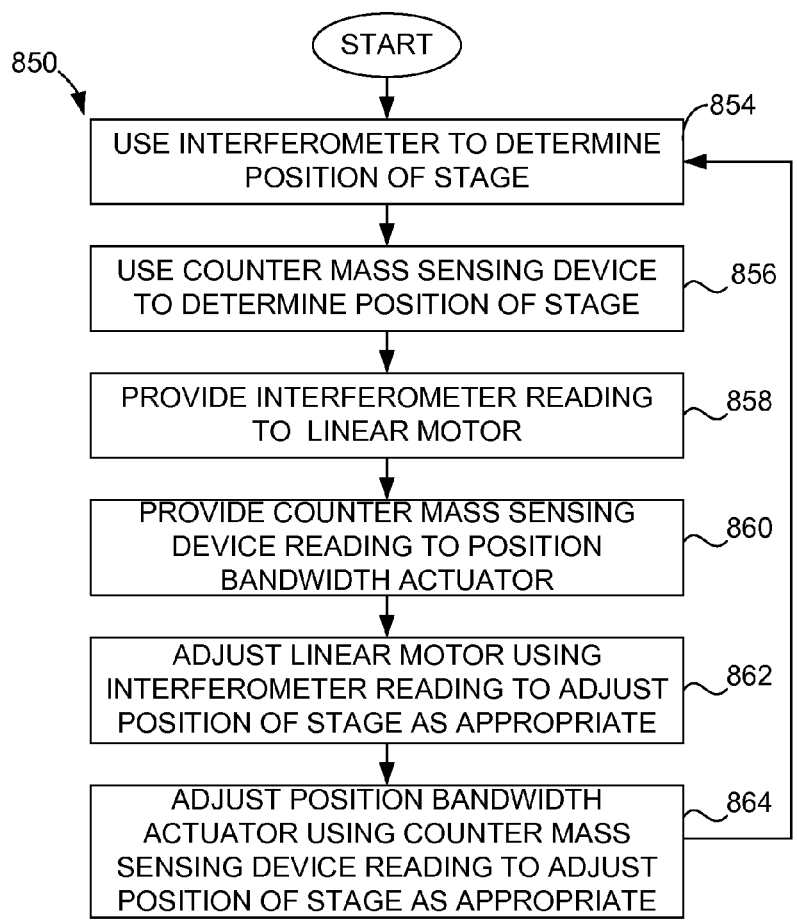
FIG. 8b is a process flow diagram which illustrates a method of controlling the movement of a stage that includes a high bandwidth position actuator using two stage position sensors in accordance with an embodiment of the present invention.

Referring next to FIG. 8b, a method of controlling the movement of a stage which includes a high bandwidth position actuator such as a piezoelectric motor or a VCM will be described in accordance with an embodiment of the present invention. A process 850 of controlling the movement of a stage begins at step 854 in which an interferometer is used to determine the position of the stage. Typically, the interferometer will determine a position of an object supported on the stage, as for example the position of a surface of a wafer or a reticle, positioned on the stage. Once the position of the stage is determined using the interferometer, a counter mass sensing device, e.g., second sensing device 740 of FIG. 7, may be used to determine a position of the stage in step 856.

In step 858, the interferometer reading obtained in step 854 may be provided to the actuator which causes the stage to scan. That is, a position reading obtained from the interferometer is passed to the actuator, e.g., linear motor. The counter mass sensing device passes a position reading to the high bandwidth position actuator which is coupled to the stage in step 860. From step 860, process flow proceeds to step 862 in which the actuator which causes the stage to scan is adjusted using the reading from the interferometer to enable the position of the stage to be adjusted as appropriate.

After the actuator is used to adjust the position of the stage, as for example in a relatively coarse manner, the high bandwidth position actuator may be adjusted in a relatively fine manner using the position reading from the counter mass sensing device in step 864. Once the high bandwidth position actuator is adjusted, process flow returns to step 854 in which the interferometer is used to determine the position of the stage.

Figure 9A:
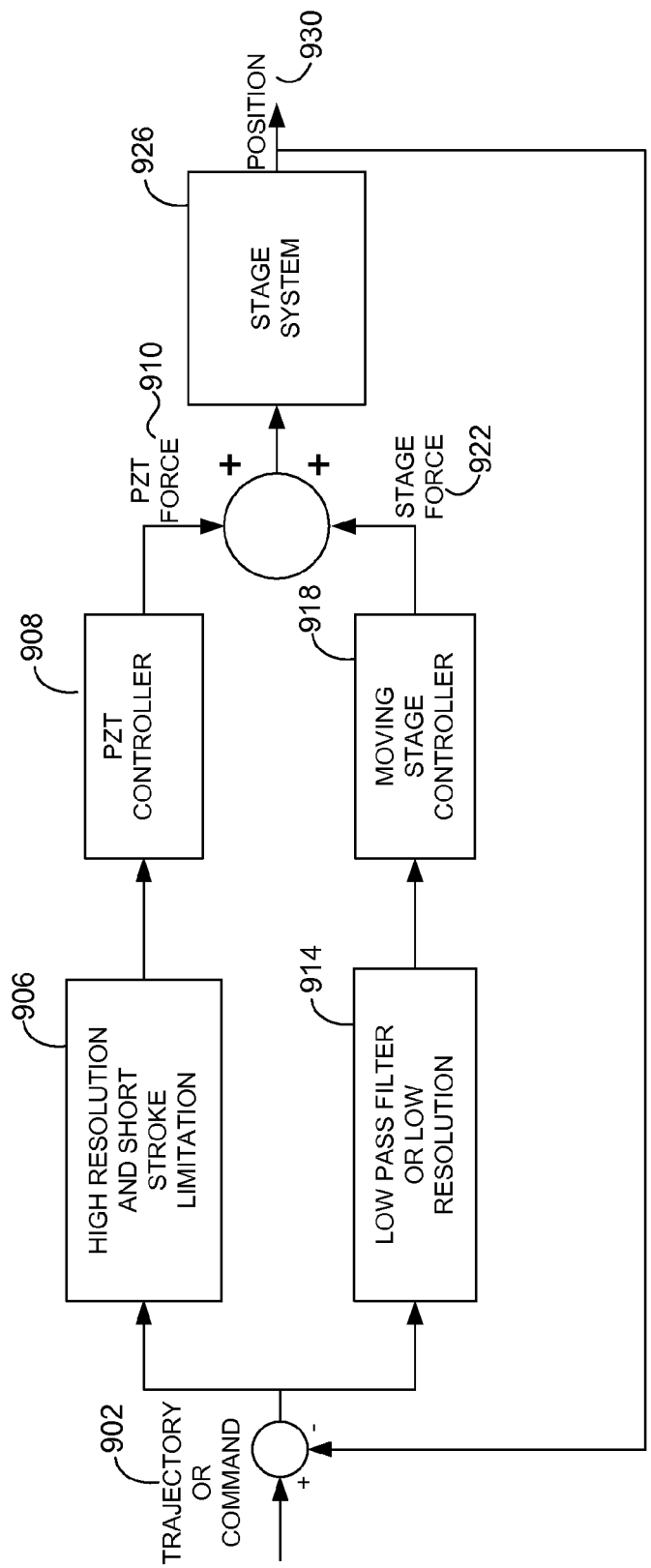
FIG. 9a is a control block diagram for a stage with a high bandwidth position actuator that is used to more precisely position a stage in accordance with an embodiment of the present invention.
Figure 9B:
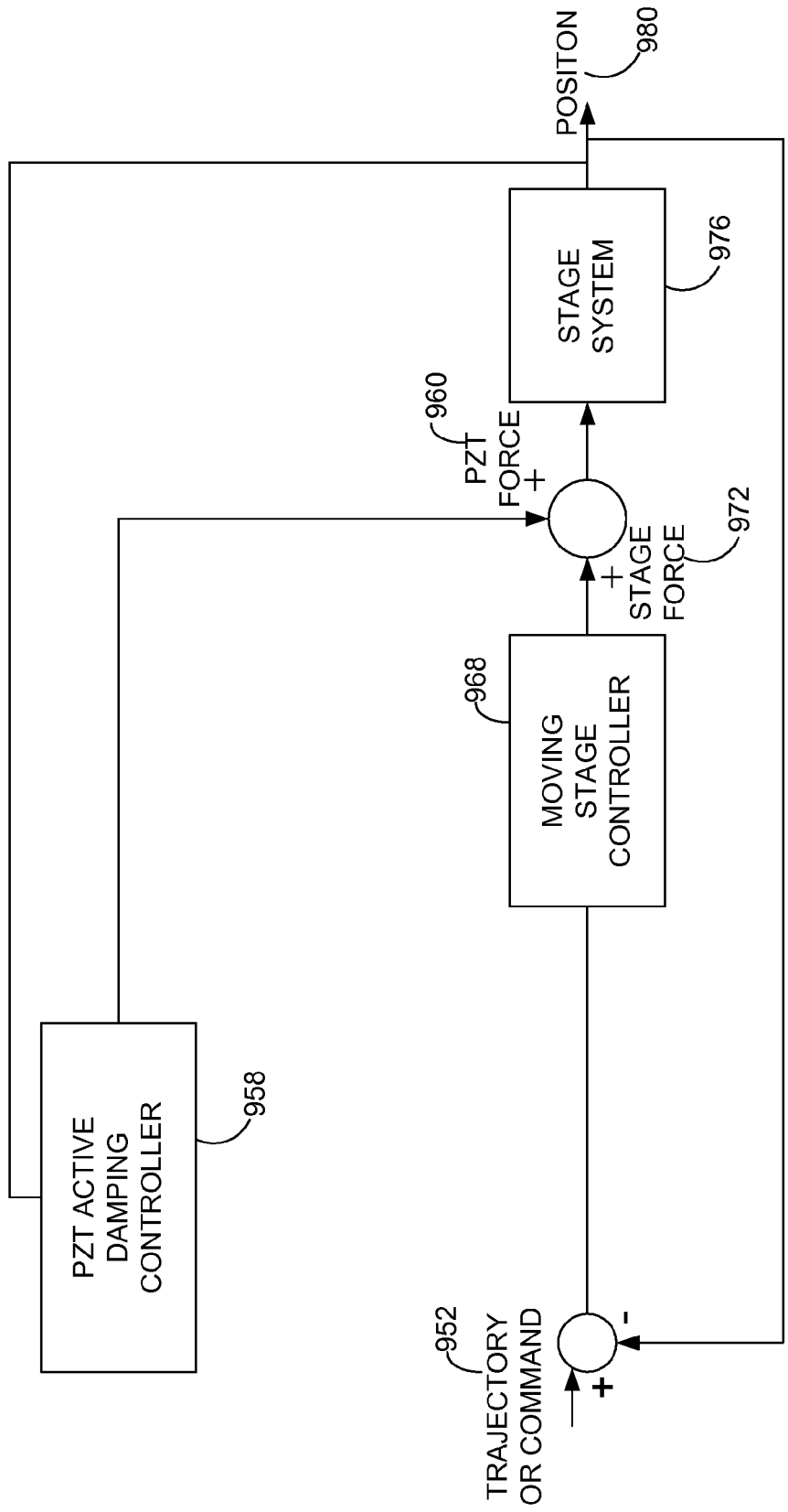
FIG. 9b is a control block diagram for a high bandwidth position actuator that is used as an active damping device in accordance with an embodiment of the present invention.

As previously mentioned, a high bandwidth position actuator may be used to enable a stage to be more precisely positioned, as well as to provide active damping capabilities to the stage. The control logic associated with a high bandwidth position actuator that is used to more precisely position a stage and the control logic associated with a high bandwidth position actuator that is used as an active damping device may vary. FIG. 9a is a control block diagram for a stage with a high bandwidth position actuator that is used to more precisely position a stage in accordance with another embodiment of the present invention, while FIG. 9b is a control block diagram for a high bandwidth position actuator that is used as an active damping device in accordance with an embodiment of the present invention. Referring to FIG. 9a, one control loop which is suitable for controlling a stage system which includes a high bandwidth position actuator that is to be used to enable precise positioning of a stage will be described. A trajectory or a command 902 which provides a desired trajectory for a stage system 926 is provided as input to a low pass filter 914 which, in turn, provides an input to a moving stage controller 918, or a controller which is arranged to control an actuator that allows a stage of stage system 926 to undergo relatively long strokes, or low resolution movements. Trajectory 902 is also provided as input to a high bandwidth position actuator controller 908, e.g., a PZT controller, which controls high bandwidth position actuator 908 with a short stroke limitation 906.

An output of controller 918, which is a stage force 922, and an output of controller 908, which is a high bandwidth position actuator force (PZT force) 910, are provided to stage system 926 such that a stage of stage system 926 may be positioned, and a position 930 of the stage may be determined by a sensor such as an interferometer. Position 930 may then be used to adjust trajectory 902, as needed, to position a stage of stage system 926 in a desired position.

When a high bandwidth position actuator is arranged to be used as an active damping device, the control loop which controls a stage system that includes the high bandwidth position actuator may differ from the control loop which controls a high bandwidth position actuator that is arranged to be used to enable a stage to be precisely positioned using relatively short strokes. FIG. 9b is one control block diagram for a high bandwidth position actuator that is suitable for use as an active damping device in accordance with an embodiment of the present invention. A trajectory or a command 952 is provided as input to a stage controller 968, or a controller which controls an actuator that enables a stage of a stage system 976 to be moved. A stage force 972 is an output from stage controller 968.

A position 980 of a stage within stage system 976 may be obtained using a sensing system, e.g., an interferometer system, of stage system 976. Position 980 is typically used to adjust trajectory 952 as appropriate. Position 980 may also be provided to an active damping controller 958, which is arranged to control a high bandwidth position actuator that functions as an active damper, such that an appropriate high bandwidth position actuator force (PZT force) 960 may be generated by the high bandwidth position actuator. Both high bandwidth position actuator force 960 and stage force 972 may be provided as inputs to stage system 972 to damp vibrations and to cause a stage within stage system 972 to move, respectively.

Figure 10:
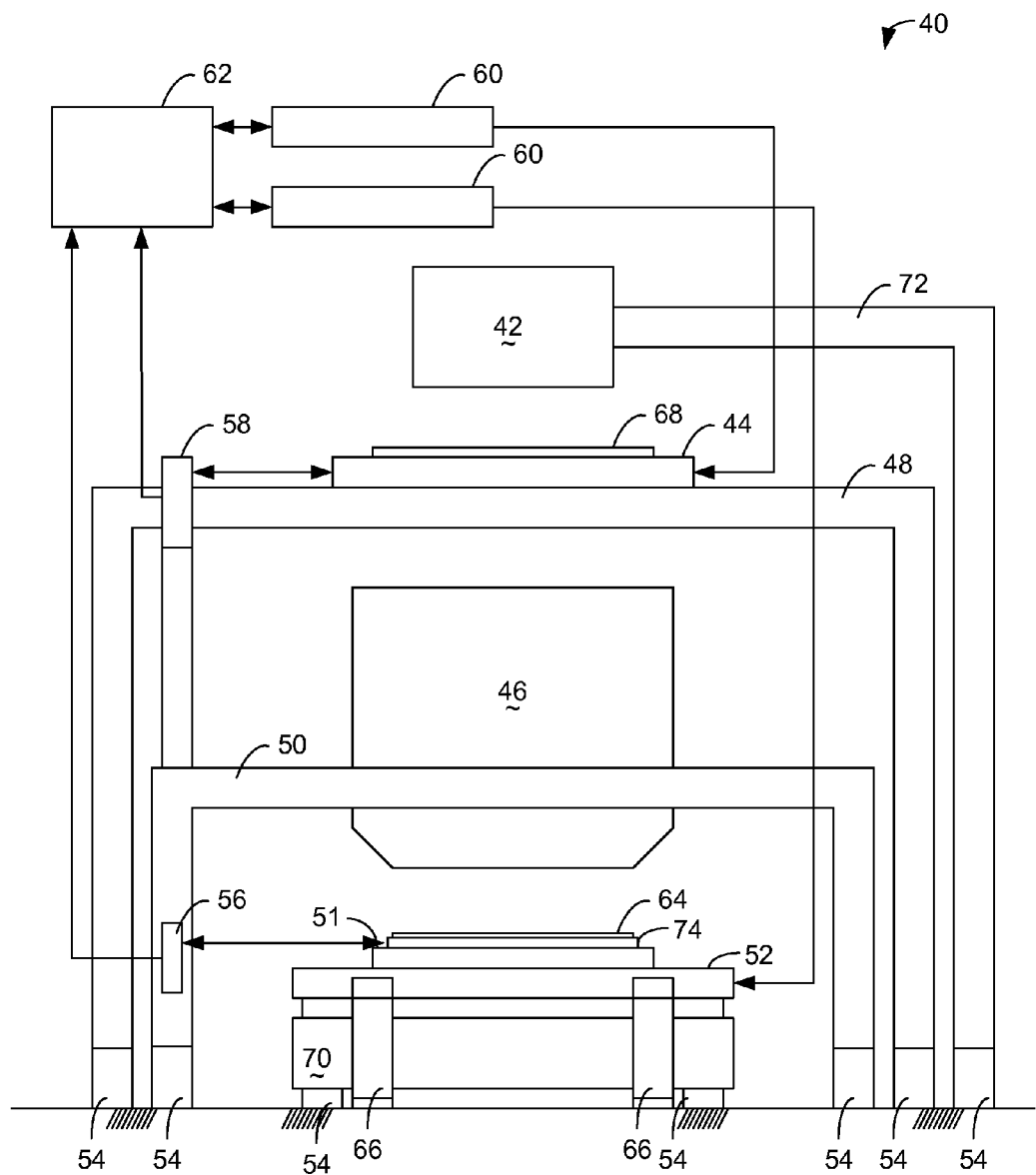
FIG. 10 is a diagrammatic representation of a photolithography apparatus in accordance with an embodiment of the present invention.

With reference to FIG. 10, a photolithography apparatus which may include a high bandwidth position actuator such as a piezoelectric motor or a VCM will be described in accordance with an embodiment of the present invention. A photolithography apparatus (exposure apparatus) 40 includes a wafer table 51 and a wafer positioning stage 52 that may be driven by a planar motor (not shown). The planar motor which drives wafer positioning stage 52 generally uses an electromagnetic force generated by magnets and corresponding armature coils arranged in two dimensions. A wafer 64 is held in place on a wafer holder or chuck 74 which is coupled to wafer table 51. Wafer positioning stage 52 is arranged to move in multiple degrees of freedom, e.g., between three to six degrees of freedom, under the control of a control unit 60 and a system controller 62. In one embodiment, wafer positioning stage 52 may include a small counter mass, as described above. The movement of wafer positioning stage 52 allows wafer 64 to be positioned at a desired position and orientation relative to a projection optical system 46.

Wafer table 51 may be levitated in a z-direction 10b by any number of voice coil motors (not shown), e.g., three voice coil motors. In the described embodiment, at least three magnetic bearings (not shown) couple and move wafer table 51 along a y-axis 10a. The motor array of wafer positioning stage 52 is typically supported by a base 70. Base 70 is supported to a ground via isolators 54. Reaction forces generated by motion of wafer stage 52 may be mechanically released to a ground surface through a frame 66. One suitable frame 66 is described in JP Hei 8-166475 and U.S. Pat. No. 5,528,118, which are each herein incorporated by reference in their entireties.

An illumination system 42 is supported by a frame 72. Frame 72 is supported to the ground via isolators 54. Illumination system 42 includes an illumination source, and is arranged to project a radiant energy, e.g., light, through a mask pattern on a reticle 68 that is supported by and scanned using a reticle stage which includes a coarse stage and a fine stage. The radiant energy is focused through projection optical system 46, which is supported on a projection optics frame 50 and may be supported the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. In one embodiment, wafer table 51 has a force damper which reduces vibrations associated with wafer table 51 such that interferometer 56 may accurately detect the position of wafer table 51. A second interferometer 58 is supported on projection optical system 46, and detects the position of reticle stage 44 which supports a reticle 68. Interferometer 58 also outputs position information to system controller 62.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head.

The illumination source of illumination system 42 may be g-line (436 nanometers (nm)), i-line (365 nm), a KrF excimer laser (248 nm), an ArF excimer laser (193 nm), and an $F_2$-type laser (157 nm). Alternatively, illumination system 42 may also use charged particle beams such as x-ray and electron beams. For instance, in the case where an electron beam is used, thermionic emission type lanthanum hexaboride ($LaB_6$) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser is used, glass materials such as quartz and fluorite that transmit far ultra-violet rays is preferably used. When either an $F_2$-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

Further, in photolithography systems, when linear motors (see U.S. Pat. No. 5,623,853 or 5,528,118, which are each incorporated herein by reference in their entireties) are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage which uses no guide.

Alternatively, a wafer stage or a reticle stage may be driven by a planar motor which drives a stage through the use of electromagnetic forces generated by a magnet unit that has magnets arranged in two dimensions and an armature coil unit that has coil in facing positions in two dimensions. With this type of drive system, one of the magnet unit or the armature coil unit is connected to the stage, while the other is mounted on the moving plane side of the stage.

Movement of the stages as described above generates reaction forces which may affect performance of an overall photolithography system. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by the reticle (mask) stage motion may be mechanically released to the floor (ground) by use of a frame member as described in U.S. Pat. No. 5,874,820 and published Japanese Patent Application Disclosure No. 8-330224, which are each incorporated herein by reference in their entireties.

Isolaters such as isolators 54 may generally be associated with an active vibration isolation system (AVIS). An AVIS generally controls vibrations associated with forces 112, i.e., vibrational forces, which are experienced by a stage assembly or, more generally, by a photolithography machine such as photolithography apparatus 40 which includes a stage assembly.

A photolithography system according to the above-described embodiments, e.g., a photolithography apparatus which may include one or more dual force actuators, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 11:
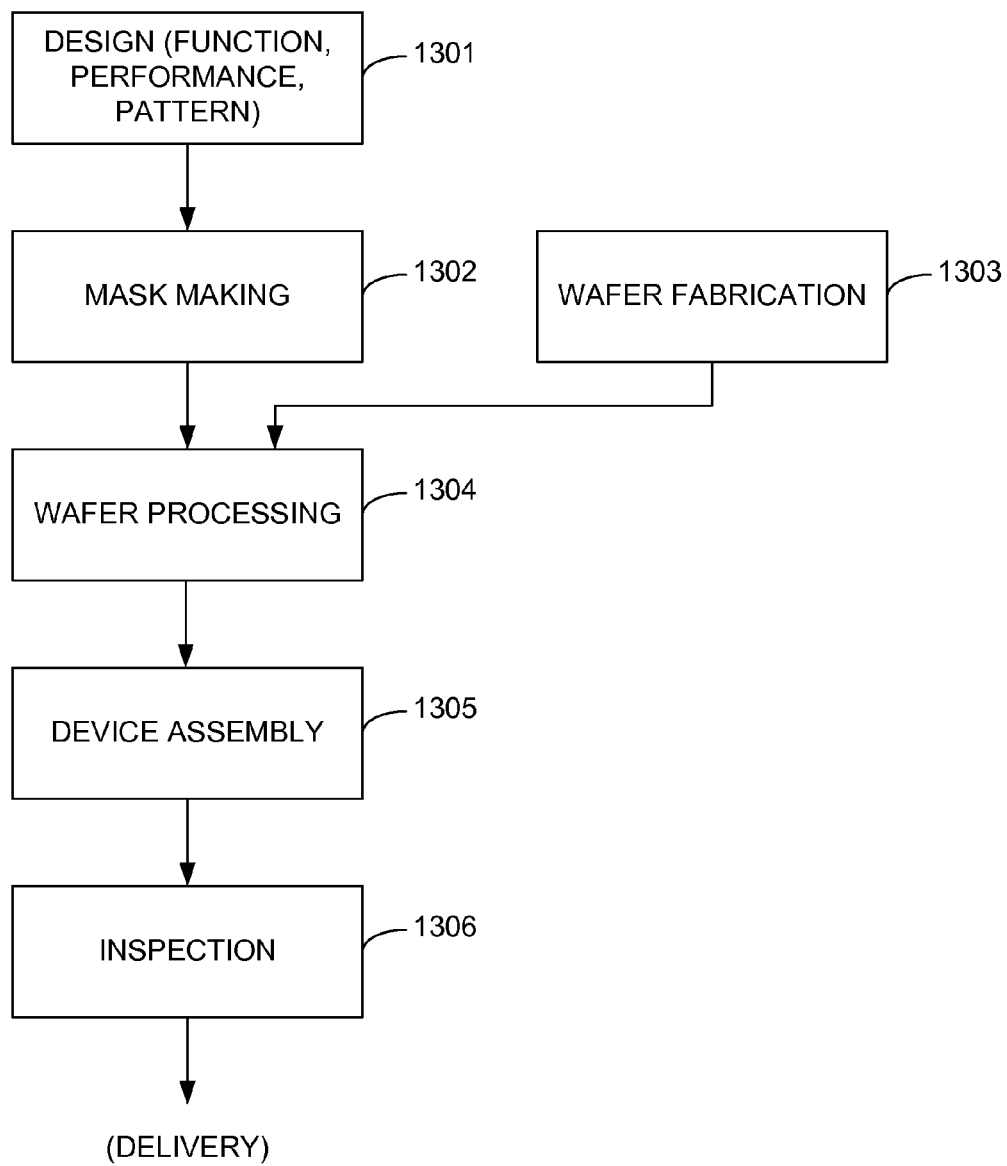
FIG. 11 is a process flow diagram which illustrates the steps associated with fabricating a semiconductor device in accordance with an embodiment of the present invention.

Further, semiconductor devices may be fabricated using systems described above, as will be discussed with reference to FIG. 11. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system. One process of exposing a mask pattern onto a wafer will be described below with respect to FIG. 12. In step 1305, the semiconductor device is assembled. The assembly of the semiconductor device generally includes, but is not limited to, wafer dicing processes, bonding processes, and packaging processes. Finally, the completed device is inspected in step 1306.

Figure 12:
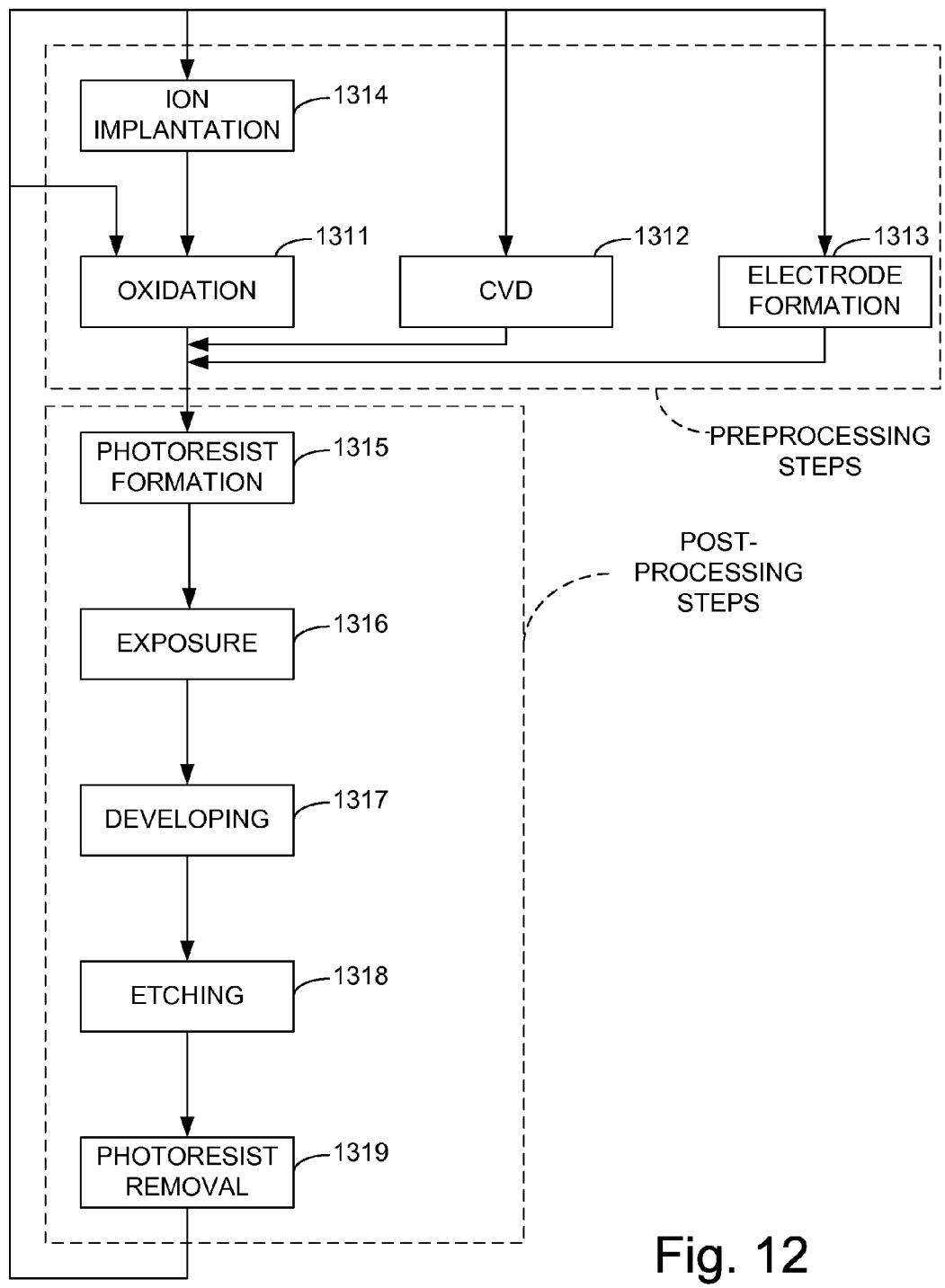
FIG. 12 is a process flow diagram which illustrates the steps associated with processing a wafer, i.e., step 1304 of FIG. 11, in accordance with an embodiment of the present invention.

FIG. 12 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 1313, electrodes are formed on the wafer by vapor deposition. Then, ions may be implanted in the wafer using substantially any suitable method in step 1314. As will be appreciated by those skilled in the art, steps 1311-1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1317. Once the exposed wafer is developed, parts other than residual photoresist, e.g., the exposed material surface, may be removed by etching. Finally, in step 1319, any unnecessary photoresist that remains after etching may be removed. As will be appreciated by those skilled in the art, multiple circuit patterns may be formed through the repetition of the pre-processing and post-processing steps.

Although only a few embodiments of the present invention have been described, it should be understood that the present invention may be embodied in many other specific forms without departing from the spirit or the scope of the present invention. By way of example, the use of a high bandwidth position actuator such as a piezoelectric motor or a VCM, either with or without a small counter mass, has generally been described as being suitable for use on a stage apparatus which includes a single moving stage. However, the use of a high bandwidth position actuator may generally be implemented for use in substantially any stage apparatus including, but not limited to, a stage apparatus which includes both a coarse stage for imparting coarse movements on an object and a fine stage for imparting fine movements on an object. When a high bandwidth position actuator is used in a stage apparatus which includes a coarse stage and a fine stage, the actuator may be used to aid the positioning of either the coarse stage or the fine stage. Alternatively, the actuator may be used to provide active damping capabilities for either the coarse stage or the fine stage. In one embodiment, a coarse stage may be coupled to one high bandwidth position actuator and a fine stage may be coupled to another high bandwidth position actuator.

While the use of a single high bandwidth position actuator has been described as being included in an overall stage apparatus, it should be appreciated that any number of high bandwidth position actuators may generally be included in an overall stage apparatus. For example, when a stage of the stage apparatus is to translate in two directions, then two separate high bandwidth position actuators may be included in the stage apparatus, i.e., one high bandwidth position actuator may be used to enable movement in a y-direction while a second high bandwidth position actuator may be used to enable movement in an x-direction.

Further, since high bandwidth position actuators generally have relatively small footprints and are relatively lightweight, a high bandwidth position actuator may be arranged to be used to enable precision position control and damping on substantially any axis along which there is movement of a stage. For example, if an overall stage apparatus has six degrees of freedom, up to six high bandwidth position actuators may be incorporated in the stage apparatus to provide position control and damping. One of the high bandwidth position actuators may be used for each degree of freedom.

In general, the location of a high bandwidth position actuator and the location of a counter mass which is effectively coupled to the high bandwidth position actuator may vary. For instance, the high bandwidth position actuator may be located substantially anywhere with respect to the stage which is to be provided high bandwidth capabilities due to the high bandwidth position actuator. Further, in one embodiment, a small counter mass which is arranged to substantially counteract reaction forces generated by a high bandwidth position actuator may be arranged to be coupled to a grounding surface of an overall stage apparatus, e.g., through a trim motor.

A primary actuator such as an actuator which enables a stage to move relatively long strokes and a secondary actuator such as a high bandwidth position actuator may be arranged to be actuated in substantially any suitable manner. By way of example, both actuators may be actuated substantially together such that both actuators move the stage substantially simultaneously. Alternatively, the actuators may be arranged such that the high bandwidth position actuator is typically actuated to move the stage using relatively short strokes after the primary actuator has completed moving the stage using relatively long strokes without departing from the spirit or the scope of the present invention.

The steps associated with the methods of the present invention may vary widely. Steps may be added, removed, altered, and reordered. For example, the processes of controlling the movement of a stage may include determining when the stage is in a desired position. Therefore, the present examples are to be considered as illustrative and not restrictive, and the invention is not to be limited to the details given herein, but may be modified within the scope of the appended claims.

What is claimed is:

1. A method for positioning a stage, the stage being arranged on a body of a stage apparatus, the stage further being arranged to carry an object, the method comprising:
    determining a first magnitude using a position reading associated with the stage;
    determining a second magnitude using the position reading;
    providing a first force of the first magnitude to the stage using a primary actuator arranged to drive the stage, the first force being arranged to cause the stage to translate along a first axis, the primary actuator having a first positioning bandwidth; and
    providing a second force of the second magnitude to the stage using a secondary actuator arranged to drive the stage, the secondary actuator being arranged to cause the stage to translate along the first axis, the secondary actuator having a second positioning bandwidth that is higher than the first positioning bandwidth, wherein the first force is arranged to enable the stage to be relatively coarsely positioned and the second force is arranged to enable the stage to be relatively finely positioned.

2. The method of claim 1 further including:
    obtaining the position reading from a sensing system associated with the stage.

3. The method of claim 1 wherein providing the second force of the second magnitude using the secondary actuator causes a reaction force to be generated with respect to the secondary actuator, and wherein the reaction force is substantially absorbed by a first counter mass coupled to the secondary actuator.

4. The method of claim 3 wherein the first counter mass is the primary actuator.

5. The method of claim 1 wherein providing the first force of the first magnitude using the primary actuator causes a reaction force to be generated with respect to the primary actuator, and wherein the reaction force is substantially absorbed by a first counter mass coupled to the primary actuator.

6. The method of claim 5 wherein the first counter mass is coupled to a trim motor, the trim motor being coupled to a ground surface.

7. The method of claim 1 wherein the secondary actuator is a piezoelectric motor.

8. The method of claim 1 wherein positioning the stage is associated with a method for operating an exposure apparatus.

9. A method for making an object including at least a photolithography process, wherein the photolithography process utilizes the method of operating an exposure apparatus of claim 8.

10. The method of claim 1 wherein the secondary actuator is connected to a first counter mass that is departed from the primary actuator.

11. The method of claim 1 wherein providing the second force of the second magnitude using the secondary actuator causes a reaction force to be generated with respect to the secondary actuator, and wherein the reaction force is substantially absorbed by an actuator arrangement, the actuator arrangement being coupled to a first counter mass and a trim motor.

12. The method of claim 11 wherein the actuator arrangement is one of a VCM and a linear motor.

13. The method of claim 1 wherein the secondary actuator is a voice coil motor.

14. A method for positioning a stage, comprising:
    determining a first magnitude using a position reading associated with the stage;
    determining a second magnitude using the position reading;
    providing a first force of the first magnitude on the stage using a primary actuator arranged to drive the stage, the first force being arranged to cause the stage to translate along a first axis; and
    providing a second force of the second magnitude on the stage using a secondary actuator, the secondary actuator being arranged to damp vibrations associated with the stage, wherein the secondary actuator is coupled to a counter mass that is arranged to substantially absorb the vibrations.

15. The method of claim 14 further including:
    obtaining the position reading from a sensing system associated with the stage.

16. The method of claim 14 wherein providing the first force of the first magnitude using the primary actuator causes a reaction force to be generated with respect to the primary actuator, and wherein the reaction force is substantially absorbed by a first counter mass coupled to the primary actuator.

17. The method of claim 14 wherein the secondary actuator is one of a voice coil motor and a piezoelectric motor.

18. The method of claim 14 wherein positioning the stage is associated with a method for operating an exposure apparatus.

19. A method for making an object including at least a photolithography process, wherein the photolithography process utilizes the method of operating an exposure apparatus of claim 18.

20. A method for making a wafer utilizing the method of operating an exposure apparatus of claim 18.

21. The method of claim 14 wherein the secondary actuator is connected to a first counter mass that is departed from the primary actuator.

22. The method of claim 14 wherein providing the first force of the first magnitude using the primary actuator causes a reaction force to be generated with respect to the primary actuator, and wherein the reaction force is substantially absorbed by an actuator arrangement coupled to the primary actuator, the actuator arrangement being coupled to a first counter mass and a trim motor.

23. The method of claim 22 wherein the actuator arrangement is one of a VCM and a linear motor.

24. A stage apparatus, the stage apparatus comprising:
    a stage;
    a first actuator, the first actuator being arranged to position the stage with respect to a first axis, wherein the first actuator is coupled to the stage;
    a first force absorption arrangement, the first force absorption arrangement being coupled to the first actuator, the first force absorption arrangement being arranged to substantially absorb reaction forces generated by the first actuator;
    a first counter mass;
    a second actuator, the second actuator being arranged to affect the position of the stage along the first axis, the second actuator having a higher positioning bandwidth than the first actuator, wherein the second actuator is coupled to the stage and is arranged to substantially support the first counter mass, the first counter mass being arranged to absorb at least some forces associated with the second actuator; and a control arrangement, the control arrangement being arranged to control the first actuator and the second actuator to position the stage.

25. The stage apparatus of claim 24 wherein the first actuator is arranged to coarsely position the stage and the second actuator is arranged to finely position the stage.

26. The stage apparatus of claim 24 wherein the first force absorption arrangement includes a second counter mass and a trim motor, the second counter mass of the first force absorption arrangement being coupled to the first actuator and positioned substantially between the first actuator and the stage.

27. The stage apparatus of claim 24 wherein the second actuator is arranged to provide damping to the stage.

28. The stage apparatus of claim 24 wherein the second actuator is arranged to provide active damping to the stage.

29. The stage apparatus of claim 24 wherein the second actuator is one of a voice coil motor, a piezoelectric motor, a preloaded voice coil motor, and a preloaded piezoelectric motor.

30. An exposure apparatus comprising the stage apparatus of claim 24.

31. A device manufactured with the exposure apparatus of claim 30.

32. A wafer on which an image has been formed by the exposure apparatus of claim 30.

33. The stage apparatus of claim 24 further comprising a second counter mass connected to the second actuator, the second counter mass including at least a part of the first actuator.

34. A stage apparatus, the stage apparatus comprising:

a moving stage, the moving stage being arranged to support an object;

a first actuator, the first actuator being arranged to position the stage with respect to a first axis, the first actuator having a first positioning bandwidth, wherein the first actuator is coupled to the stage and is arranged to enable the stage to be positioned using relatively long strokes;

a first counter mass;

a second actuator, the second actuator being a piezoelectric actuator, the second actuator having a second positioning bandwidth, the second positioning bandwidth being higher than the first positioning bandwidth, the second actuator being arranged to affect the position of the stage along the first axis, wherein the second actuator is coupled to the stage and the first counter mass;

a control arrangement, the control arrangement being arranged to control the first actuator and the second actuator to position the stage; and an interferometer system, the interferometer system being arranged to determine a position of the object supported on the moving stage, wherein the control arrangement is arranged to use the determined position to control the first actuator and the second actuator.

35. The stage apparatus of claim 34 further including:

a second counter mass; and a trim motor, the second counter mass being coupled substantially between the trim motor and the moving stage, the trim motor further being coupled to a ground surface, wherein the second counter mass and the trim motor are arranged to cooperate to substantially prevent vibrations from being transmitted between the ground surface and the moving stage.

36. The stage apparatus of claim 35 wherein the second actuator is substantially directly coupled between the stage and the first counter mass such that at least one of reaction forces associated with the second actuator and vibrations associated with the moving stage are substantially absorbed by the first counter mass.

37. The stage apparatus of claim 35 wherein the second counter mass includes at least a part of the first actuator.

38. The stage apparatus of claim 34 wherein the second actuator is a preloaded piezoelectric motor.

39. The stage apparatus of claim 34 wherein the first actuator is one of a linear motor and a voice coil motor.

40. A device manufactured with the exposure apparatus of claim 39.

41. The stage apparatus of claim 39 wherein the first actuator is coupled to a trim motor and to a second counter mass.

42. An exposure apparatus comprising the stage apparatus of claim 34.

43. A wafer on which an image has been formed by the exposure apparatus of claim 42.

* * * * *